United States Patent
Sakamoto et al.

(10) Patent No.: US 11,781,242 B2
(45) Date of Patent: Oct. 10, 2023

(54) METHOD FOR CONTROLLING CONVECTION PATTERN OF SILICON MELT, METHOD FOR PRODUCING SILICON SINGLE CRYSTALS, AND DEVICE FOR PULLING SILICON SINGLE CRYSTALS

(71) Applicant: SUMCO CORPORATION, Tokyo (JP)

(72) Inventors: Hideki Sakamoto, Tokyo (JP); Wataru Sugimura, Tokyo (JP); Ryusuke Yokoyama, Tokyo (JP); Naoki Matsushima, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/971,441

(22) PCT Filed: Feb. 27, 2019

(86) PCT No.: PCT/JP2019/007445
§ 371 (c)(1),
(2) Date: Aug. 20, 2020

(87) PCT Pub. No.: WO2019/167989
PCT Pub. Date: Sep. 6, 2019

(65) Prior Publication Data
US 2020/0399783 A1 Dec. 24, 2020

(30) Foreign Application Priority Data
Feb. 28, 2018 (JP) ................................ 2018-035833

(51) Int. Cl.
*C30B 29/06* (2006.01)
*C30B 15/20* (2006.01)
(Continued)

(52) U.S. Cl.
CPC .............. *C30B 29/06* (2013.01); *C30B 15/14* (2013.01); *C30B 15/206* (2013.01); *C30B 30/04* (2013.01)

(58) Field of Classification Search
CPC ....... C30B 15/14; C30B 15/20; C30B 15/206; C30B 15/305; C30B 29/06; C30B 30/04
See application file for complete search history.

(56) References Cited

U.S. PATENT DOCUMENTS 6,458,204 B1 * 10/2002 Okui ...................... C30B 15/305
117/30
2002/0129759 A1 * 9/2002 Fujiwara ................. C30B 29/06
117/33
(Continued)

FOREIGN PATENT DOCUMENTS

CN 1737216 A 2/2006
CN 101435107 A 5/2009
(Continued)

OTHER PUBLICATIONS

Notice of Allowance for JP App. No. 2018-035833, dated Jan. 26, 2021 (w/ partial translation).
(Continued)

*Primary Examiner* — Hua Qi
(74) *Attorney, Agent, or Firm* — GREENBLUM & BERNSTEIN, P.L.C.

(57) ABSTRACT

A convection pattern control method includes: heating a silicon melt in a quartz crucible using a heating portion; and applying a horizontal magnetic field to the silicon melt in the quartz crucible being rotated. In the heating of the silicon, the silicon melt is heated with the heating portion whose heating capacity differs on both sides across an imaginary line passing through a center axis of the quartz crucible and being in parallel to a central magnetic field line of the horizontal magnetic field when the quartz crucible is viewed (Continued)

from vertically above. In the applying of the horizontal magnetic field, the horizontal magnetic field of 0.2 tesla or more is applied to fix a direction of a convection flow in a single direction in a plane orthogonal to an application direction of the horizontal magnetic field in the silicon melt.

4 Claims, 9 Drawing Sheets

(51) Int. Cl.
*C30B 30/04* (2006.01)
*C30B 15/14* (2006.01)

(56) References Cited

U.S. PATENT DOCUMENTS

| | | | |
|---|---|---|---|
| 2004/0118334 A1* | 6/2004 | Weber | C30B 29/06 117/19 |
| 2004/0192015 A1* | 9/2004 | Ammon | C30B 29/06 438/502 |
| 2005/0205004 A1 | 9/2005 | Sakurada et al. | |
| 2008/0047485 A1 | 2/2008 | Cho | |
| 2008/0060572 A1* | 3/2008 | Fu | C30B 29/06 117/32 |
| 2010/0107966 A1* | 5/2010 | Javidi | C30B 29/06 117/35 |

FOREIGN PATENT DOCUMENTS

| | | | |
|---|---|---|---|
| CN | 101498032 A | 8/2009 | |
| CN | 105239154 A | 1/2016 | |
| CN | 107407003 A | 11/2017 | |
| JP | 2671914 B2 | 11/1997 | |
| JP | 2000-272992 | 10/2000 | |
| JP | 2004-196655 | 7/2004 | |
| JP | 2004-315292 | 11/2004 | |
| JP | 2006-143582 | 6/2006 | |
| JP | 2007-84417 | 4/2007 | |
| JP | 2010-132498 A | 6/2010 | |
| JP | 2014189468 A * | 10/2014 | ............ C30B 15/20 |
| JP | 2016-98147 | 5/2016 | |
| KR | 10-2004-0045454 A | 6/2004 | |
| KR | 20090008969 A * | 1/2009 | |
| KR | 20090008969 A * | 1/2009 | |
| KR | 10-2010-0040042 | 4/2010 | |
| KR | 10-2017-0079371 A | 7/2017 | |

OTHER PUBLICATIONS

Official Communication issued in International Bureau of WIPO Patent Application No. PCT/JP2019/007445, dated Apr. 23, 2019.
Office Action for CN App. No. 201980015987.5, dated Jul. 21, 2021 (w/ translation).
IPRP for PCT/JP2019/007445, dated Sep. 1, 2020.
Office Action for KR App. No. 10-2020-7023550, dated Oct. 21, 2021 (w/ translation).

* cited by examiner

METHOD FOR CONTROLLING CONVECTION PATTERN OF SILICON MELT, METHOD FOR PRODUCING SILICON SINGLE CRYSTALS, AND DEVICE FOR PULLING SILICON SINGLE CRYSTALS

TECHNICAL FIELD

The present invention relates to a convection pattern control method of a silicon melt, a manufacturing method of monocrystalline silicon, and a pull-up device of monocrystalline silicon.

BACKGROUND ART

A method called Czochralski method (hereinafter, referred to as CZ method) is used for manufacturing monocrystalline silicon. In such a manufacturing method using the CZ method, various studies have been made for improving a quality of monocrystalline silicon (see, for instance, Patent Literatures 1 and 2).

Patent Literature 1 discloses that point defects can be reduced by pulling up monocrystalline silicon while controlling a temperature of a silicon melt to be uniform in a radius direction of the monocrystalline silicon.

Patent Literature 2 discloses that a fluctuation in an impurity concentration or a dopant concentration of monocrystalline silicon in a radius direction can be reduced by misaligning a rotation axis of the monocrystalline silicon with a rotation axis of a crucible, in other words, by generating a temperature distribution different from that in rotation symmetry in a region of solidification front in a silicon melt.

CITATION LIST

Patent Literature(s)

Patent Literature 1 JP 2006-143582 A
Patent Literature 2 JP 2004-196655 A

SUMMARY OF THE INVENTION

Problem(s) to be Solved by the Invention

Although monocrystalline silicon is required to have an oxygen concentration falling within a predetermined range in addition to the above quality, the oxygen concentration is sometimes different between monocrystalline silicon ingots even when such a method as those of Patent Literatures 1 and 2 is used.

An object of the invention is to provide a convection pattern control method of a silicon melt for reducing a variation in an oxygen concentration of monocrystalline silicon, a manufacturing method of monocrystalline silicon, and a pull-up device of monocrystalline silicon.

Means for Solving the Problem(s)

According to an aspect of the invention, a convection pattern control method of a silicon melt used for manufacturing monocrystalline silicon includes: heating the silicon melt in a quartz crucible in a magnetic-field-free state with a heating portion; and applying a horizontal magnetic field to the silicon melt in the quartz crucible being rotated, in which in the heating of the silicon melt, the silicon melt is heated with the heating portion whose heating capacity differs on both sides across an imaginary line passing through a center axis of the quartz crucible and being in parallel to a central magnetic field line of the horizontal magnetic field when the quartz crucible is viewed from vertically above, and in the applying of the horizontal magnetic field, the horizontal magnetic field of 0.2 tesla or more is applied to fix a direction of a convection flow in a single direction in the silicon melt in a plane orthogonal to a direction in which the horizontal magnetic field is applied.

While the horizontal magnetic field is not applied to the silicon melt, a downward flow, which once rises from an outer part of the silicon melt and then flows downward at a central part of the silicon melt, is generated in the silicon melt in the rotating quartz crucible. In producing the silicon melt, in a right-handed XYZ Cartesian coordinate system defining a center of a surface of the silicon melt as an origin, a vertically upward direction as a positive direction of a Z axis, and a direction in which the horizontal magnetic field is applied as a positive direction of a Y axis, when the silicon melt is applied with a heating temperature that is lower in a position direction of an X axis than in a negative direction thereof with respect to the imaginary line as viewed from the positive direction of the Z axis, an upward flow in the negative direction of the X axis becomes larger than an upward flow in the positive direction of the X axis and a downward flow is generated on a side where the heating temperature is lower (i.e., in the position direction of the X axis). When the horizontal magnetic field of 0.2 tesla or more is applied to the silicon melt in a manner to pass through the center axis of the quartz crucible, the upward flow in the positive direction of the X axis disappears, so that only the upward flow in the negative direction remains. As a result, a clockwise convection flow is generated at any positions in the silicon melt in the application direction of the horizontal magnetic field, in a plane (magnetic-field orthogonal cross-section) orthogonal to the application direction of the horizontal magnetic field in the silicon melt viewed from the negative direction of the Y axis.

In contrast, when the heating temperature is higher in the positive direction of the X axis than in negative direction thereof, an anticlockwise convection flow is generated.

Oxygen eluted from the quartz crucible is delivered by the convection of the silicon melt to a growing solid-liquid interface and is captured into the monocrystalline silicon.

Since the pull-up device of monocrystalline silicon, which is symmetrically designed, is not strictly symmetric with regard to the components thereof, a thermal environment in the chamber and/or a flow of gas (e.g., inert gas) is also sometimes not symmetric. In a pull-up device with a symmetric structure, since the thermal environment and the gas flow are also symmetric, an amount of oxygen captured into the monocrystalline silicon growing through the same process is constant irrespective of the direction of the convection flow of the silicon melt. However, in a pull-up device with an asymmetric structure, since the thermal environment and the gas flow are asymmetric, the oxygen amount delivered to the monocrystalline silicon varies depending on whether the convection flow is clockwise or anticlockwise. Consequently, the monocrystalline silicon differing in terms of an oxygen concentration is manufactured depending on whether the convection flow is clockwise or anticlockwise.

According to the aspect of the invention, use of the heating portion having the heating capacity differing on both sides across the imaginary line can lower the temperature of the silicon melt on the side of the lower heating capacity than on the side of the higher heating capacity irrespective symmetry of the structure of the pull-up device, so that the position of the downward flow can be easily fixed on the side of the lower heating capacity. By applying the horizontal magnetic field of 0.2 tesla or more in this state, the direction of the convection flow can be easily fixed in a single direction, so that a variation in the oxygen concentration between the monocrystalline silicon ingots can be restrained.

In the convection pattern control method according to the above aspect, it is preferable that the heating capacity of the heating portion is set in a first state where the heating capacity of the heating portion is lower in a positive direction than in a negative direction of an X axis or in a second state where the heating capacity of the heater is higher in the positive direction than in the negative direction of the X axis with respect to the imaginary line as viewed from a positive direction of a Z axis in a right-handed XYZ Cartesian coordinate system defining a center of a surface of the silicon melt as an origin, a vertically upward direction as the positive direction of the Z axis, and a direction in which the horizontal magnetic field is applied as a positive direction of a Y axis, and in the applying of the horizontal magnetic field, the direction of the convection flow as viewed in a negative direction of the Y axis is fixed clockwise when the heating capacity is in the first state, and the direction of the convection flow is fixed anticlockwise when the heating capacity is in the second state.

In the convection pattern control method according to the above aspect, it is preferable that in the heating of the silicon melt, the silicon melt is heated such that a difference between a maximum temperature and a minimum temperature on the surface of the silicon melt is 6 degrees C. or more.

With this arrangement, the direction of the convection flow can be securely fixed in a single direction.

In the convection pattern control method according to the above aspect, it is preferable that in the heating of the silicon melt, the silicon melt is heated such that the difference between the maximum temperature and the minimum temperature is 12 degrees C. or less.

With this arrangement, the convection flow can be restrained from becoming excessively large, so that a variation in the diameter of the monocrystalline silicon in the pull-up direction can be restrained.

According to another aspect of the invention, a manufacturing method of monocrystalline silicon includes: conducting the convection pattern control method of the silicon melt according to the above aspect; and pulling up the monocrystalline silicon while an intensity of the horizontal magnetic field is kept at 0.2 tesla or more.

According to still another aspect of the invention, a pull-up device of monocrystalline silicon includes: a quartz crucible; a heating portion configured to heat a silicon melt in the quartz crucible; and magnetic-field applying portions located across the quartz crucible and configured to apply a horizontal magnetic field of 0.2 tesla or more to the silicon melt, in which a heating capacity of the heating portion differs on both sides across an imaginary line passing through a center axis of the quartz crucible and being in parallel to a central magnetic field line of the horizontal magnetic field when the quartz crucible is viewed from vertically above.

According to the above aspect of the invention, the pull-up device capable of restraining a variation in the oxygen concentration between the monocrystalline silicon ingots can be provided.

In the pull-up device of the monocrystalline silicon according to the above aspect, it is preferable that the heating portion includes a heater surrounding the quartz crucible, and the heater has a resistance value differing in regions on the respective sides.

In the pull-up device of the monocrystalline silicon according to the above aspect, it is preferable that the heating portion includes a heater surrounding the quartz crucible, and a voltage-applying portion configured to apply voltage to the heater, the heater includes a first section heater on one side and a second section heater on the other side with respect to the imaginary line, and the voltage-applying portion applies voltage such that power outputted by the first section heater is different from power outputted by the second section heater.

In the pull-up device of the monocrystalline silicon according to the above aspect, it is preferable that the heating portion includes a heater surrounding the quartz crucible, and a heat insulation material surrounding the heater, and the heat insulation material has a heat insulation performance differing in regions on the respective sides.

With this arrangement, a variation in the oxygen concentration between the monocrystalline silicon ingots can be restrained by a simple method of only differentiating the resistance values of the heater on both the sides across the imaginary line, section heater powers of the first and second section heaters of the heater, or the heat insulation performances of the heat insulation material in the regions on both the sides across the imaginary line.

BRIEF DESCRIPTION OF DRAWING(S)

FIG. 1 schematically shows an arrangement of a pull-up device according to a first exemplary embodiment of the invention.

Figure 3:
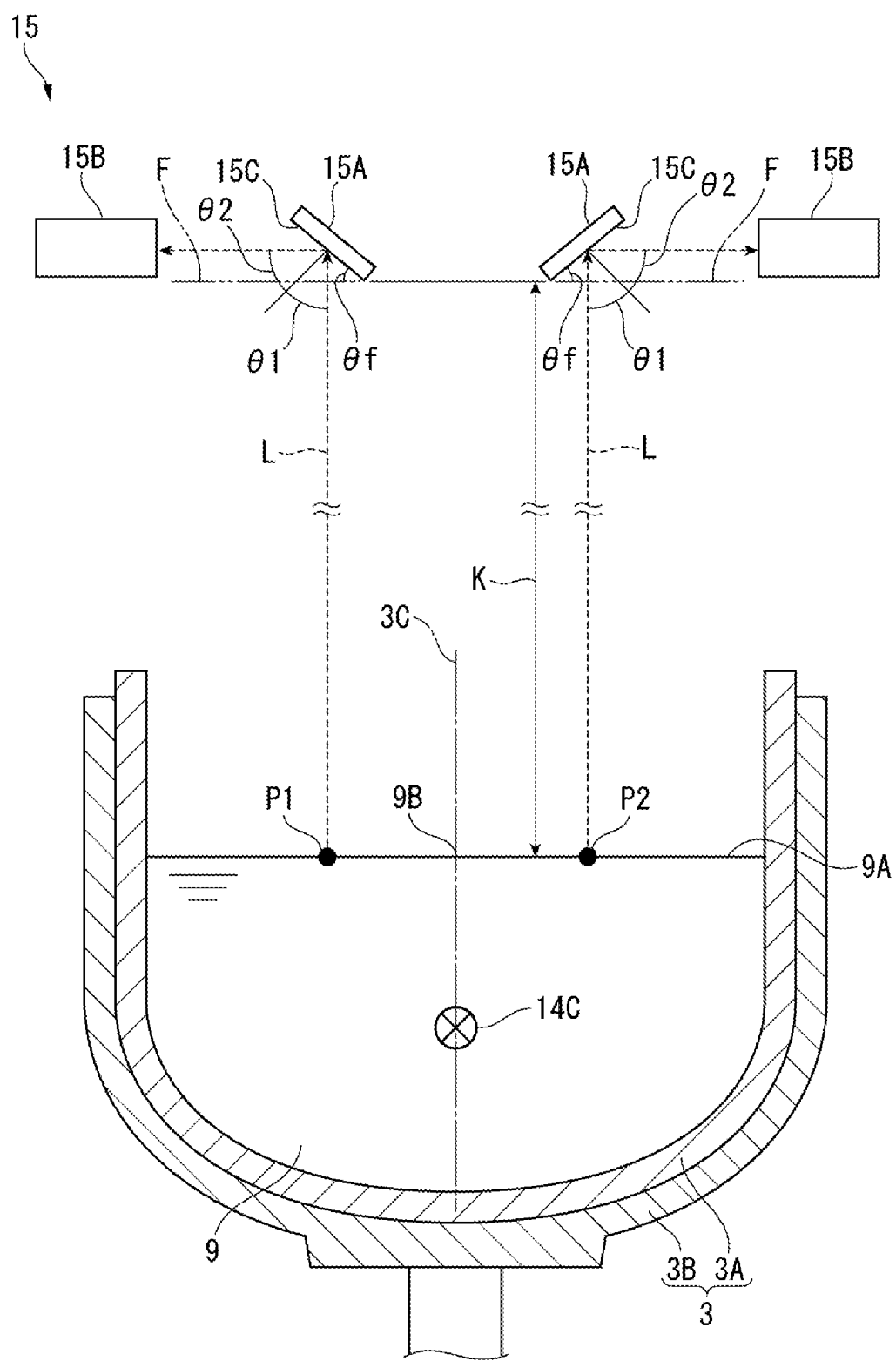

FIG. 3 schematically shows a layout of temperature sensors in the first exemplary embodiment, a second exemplary embodiment and a third exemplary embodiment of the invention.

Figure 4:
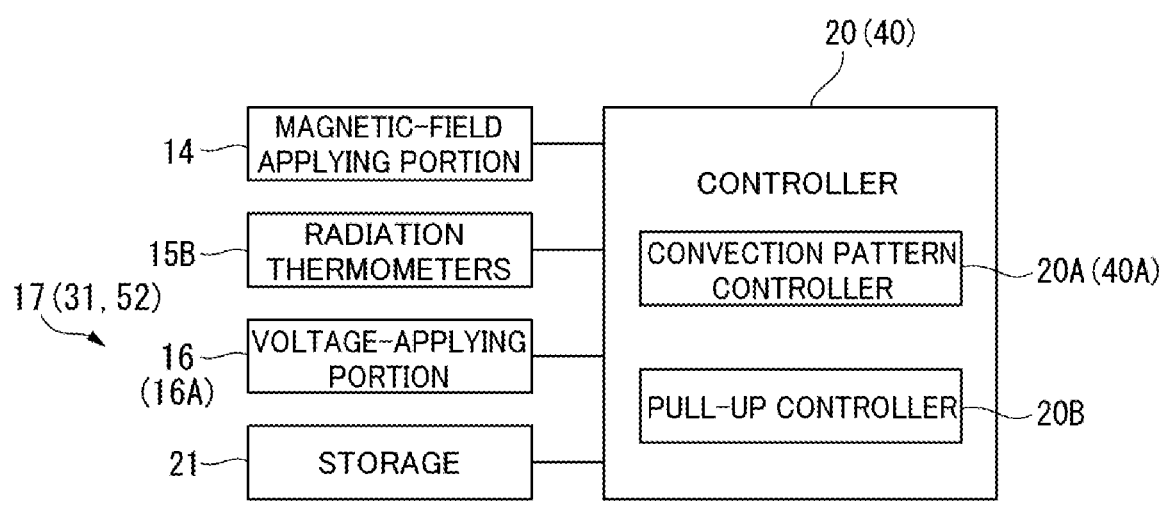

FIG. 4 is a block diagram showing a relevant part of the pull-up device in the first to third exemplary embodiments.

Figure 5A:
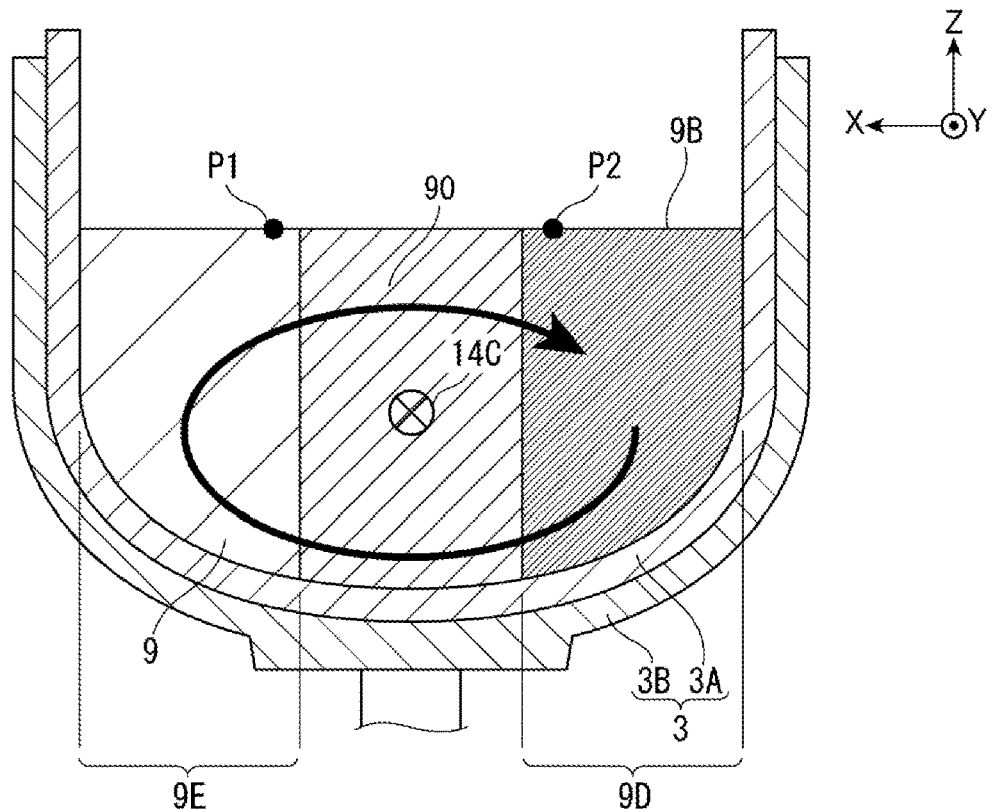

FIG. 5A schematically shows a relationship between the application direction of the horizontal magnetic field and a direction of a convection flow in the silicon melt in the first and second exemplary embodiments of the invention, showing a clockwise convection flow.

Figure 5B:
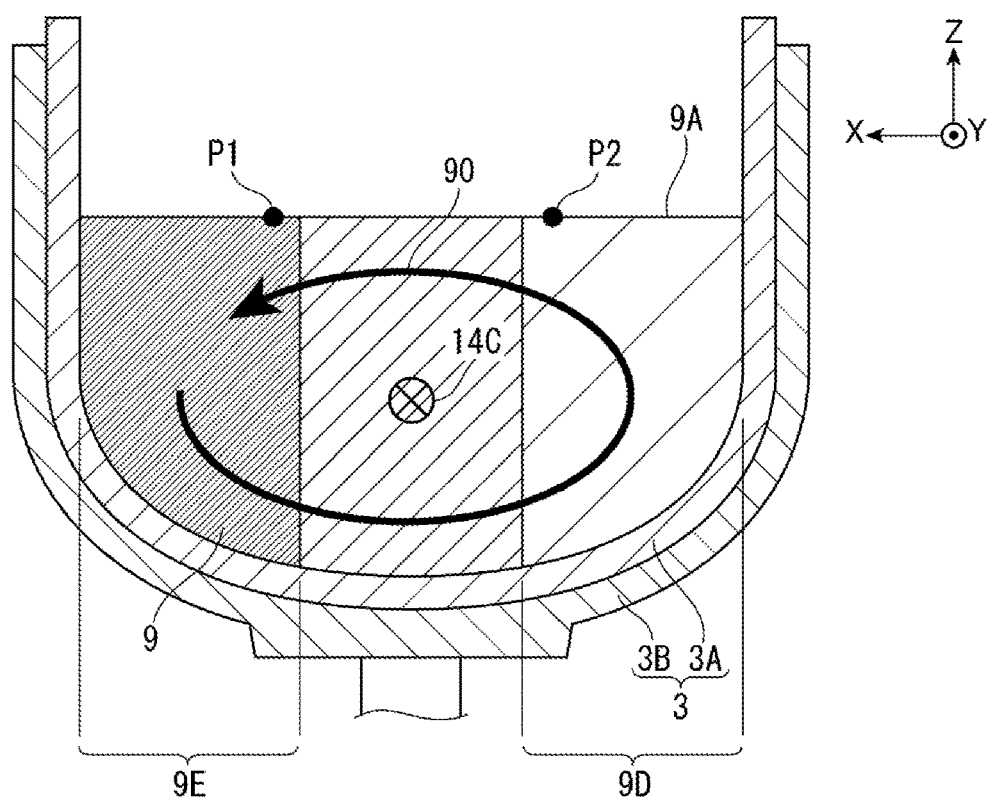

FIG. 5B schematically shows a relationship between the application direction of the horizontal magnetic field and a direction of a convection flow in the silicon melt in the first and second exemplary embodiments of the invention, showing an anticlockwise convection flow.

Figure 6:
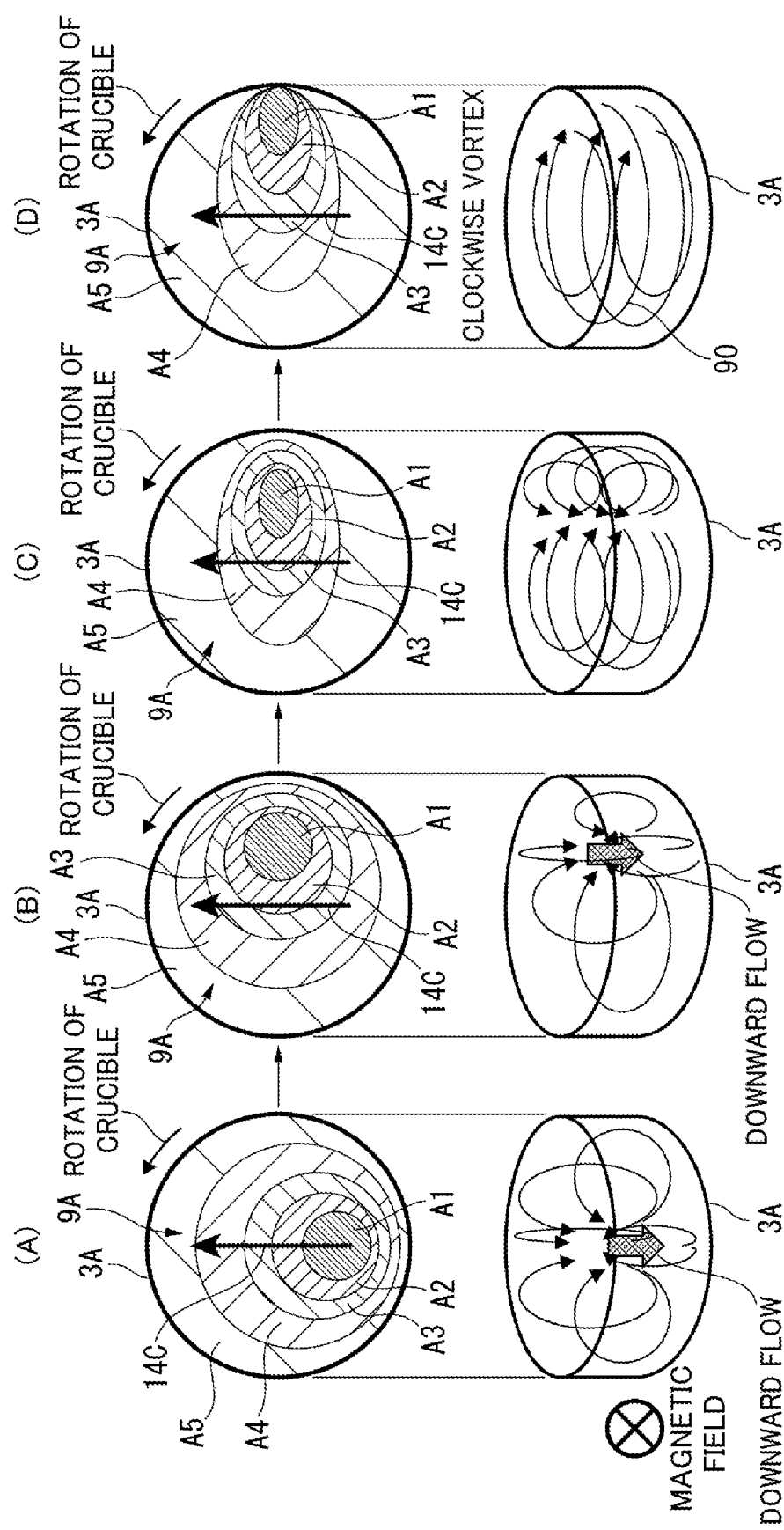

FIG. 6 schematically shows a change in the convection flow in the silicon melt in the first and second exemplary embodiments.

Figure 7:
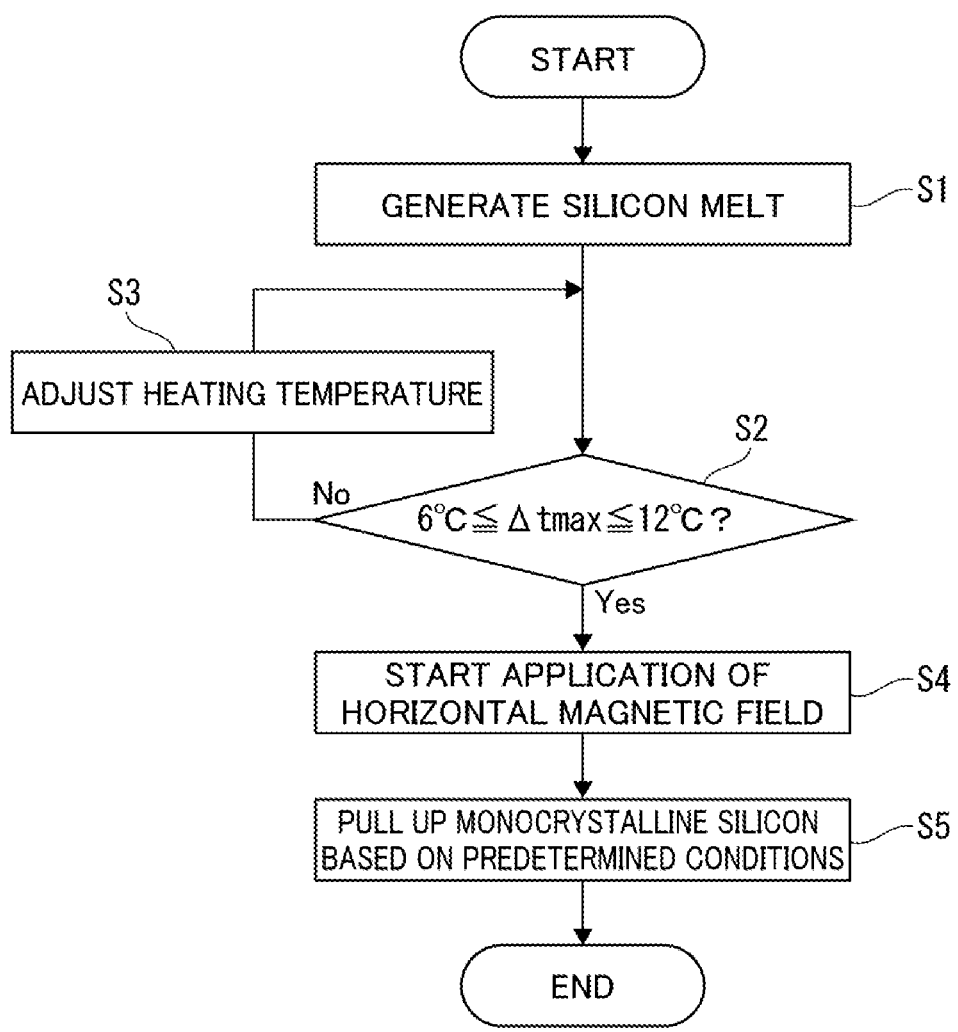

FIG. 7 is a flowchart showing a manufacturing method of monocrystalline silicon in the first and second exemplary embodiments.

Figure 8A:
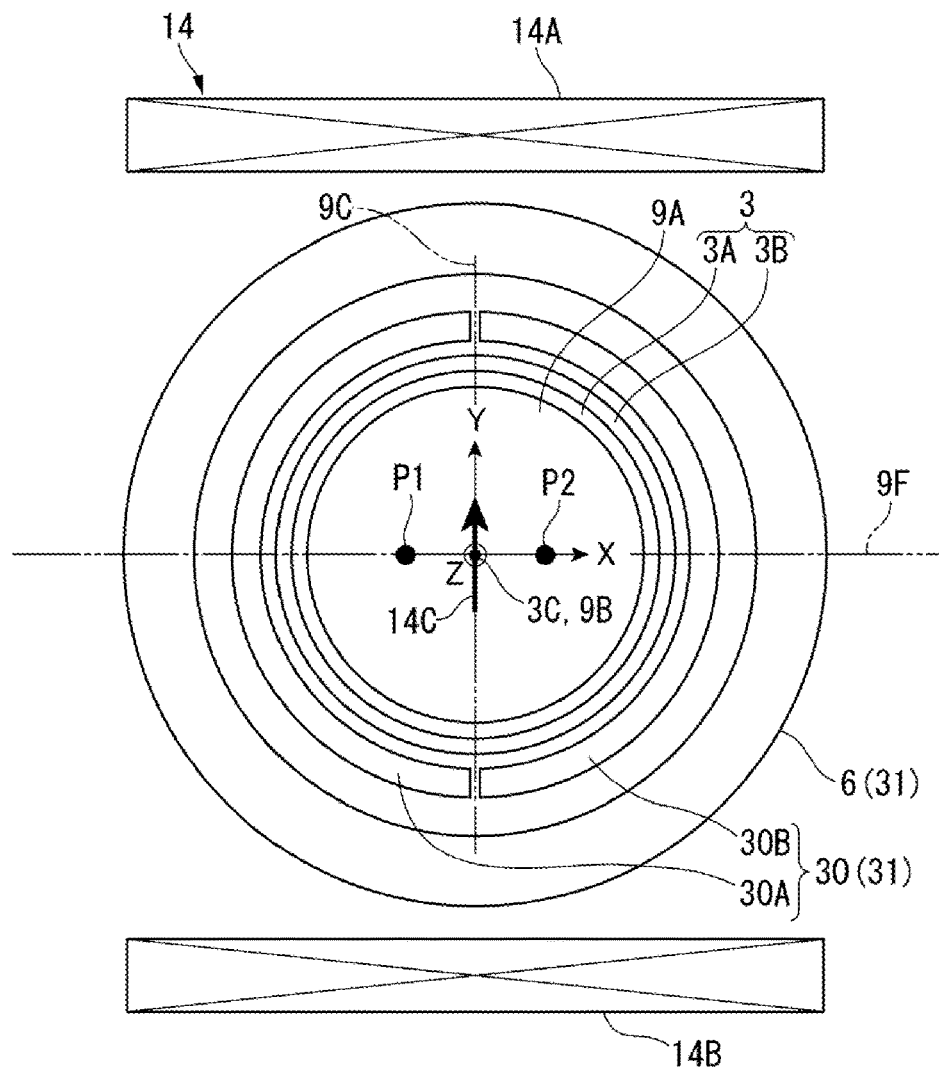

FIG. 8A is a plan view schematically showing a structure of a heating portion and how a horizontal magnetic field is applied in a second exemplary embodiment.

Figure 8B:
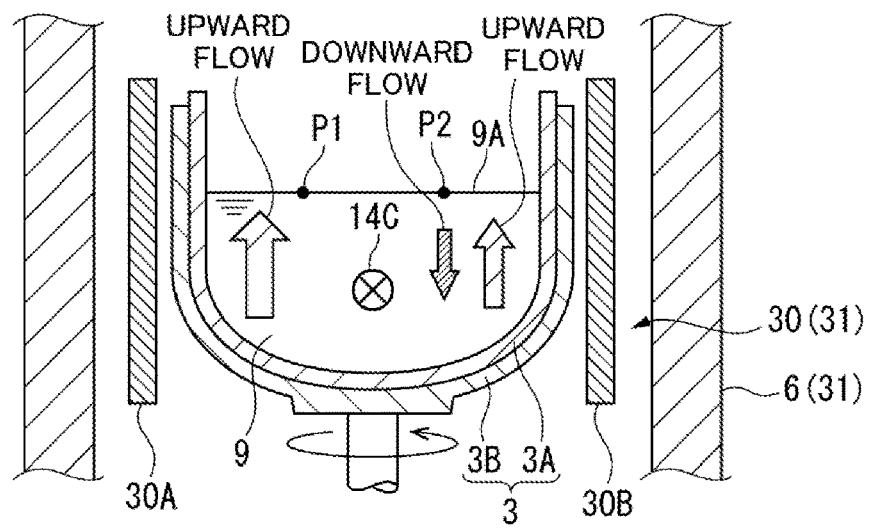

FIG. 8B is a vertical cross section schematically showing the structure of the heating portion and how the horizontal magnetic field is applied in the second exemplary embodiment.

Figure 9A:
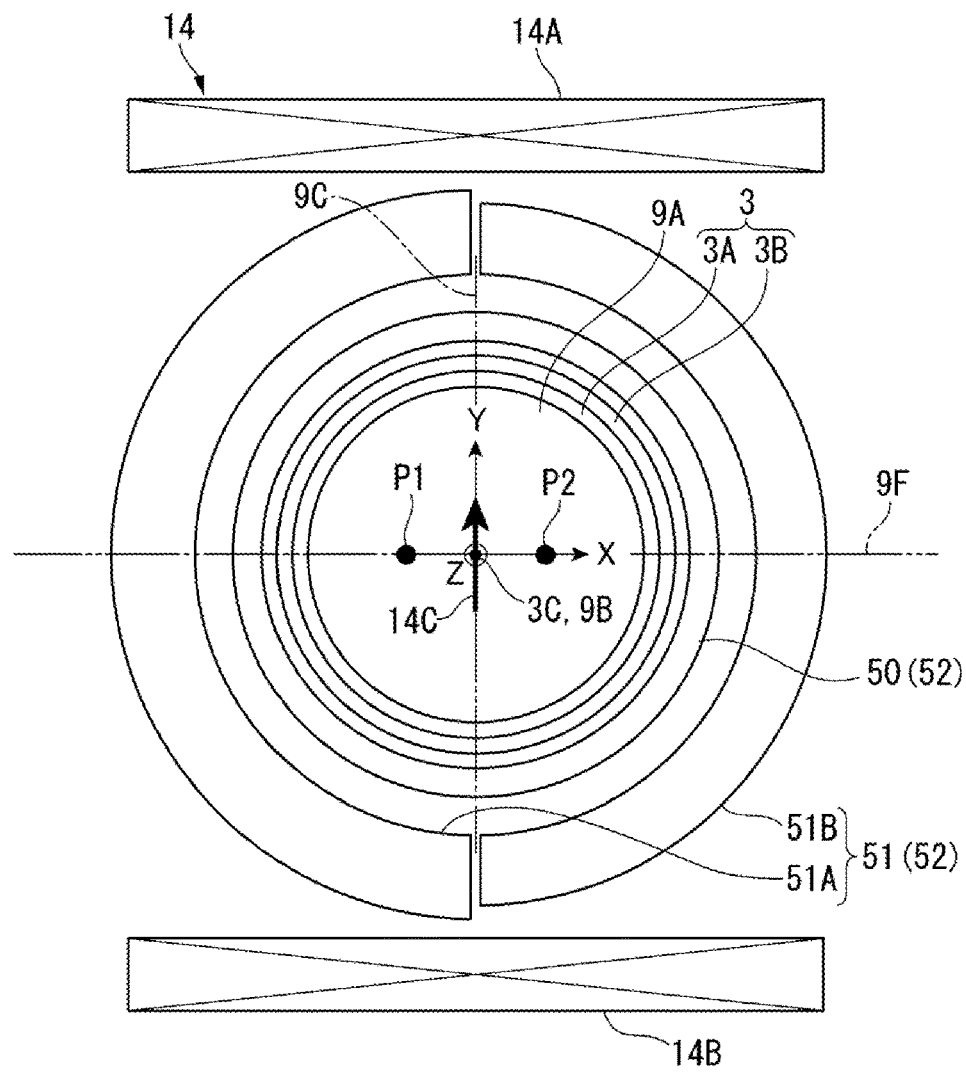

FIG. 9A is a plan view schematically showing a structure of a heating portion and how a horizontal magnetic field is applied in a third exemplary embodiment.

Figure 9B:
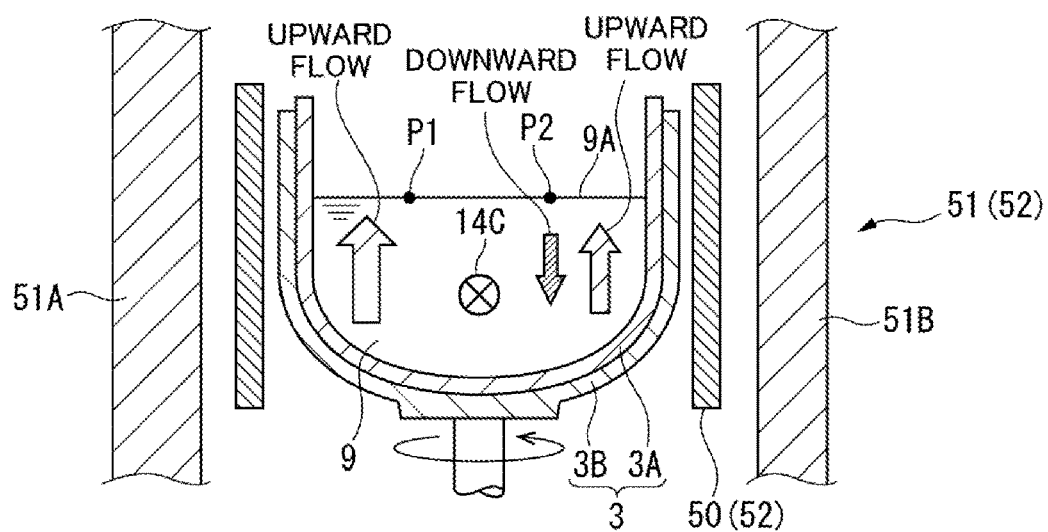

FIG. 9B is a vertical cross section schematically showing the structure of the heating portion and how the horizontal magnetic field is applied in the third exemplary embodiment.

DESCRIPTION OF EMBODIMENT(S)

Exemplary embodiments of the invention will be described below with reference to the attached drawings.

[1] First Exemplary Embodiment

Figure 1:
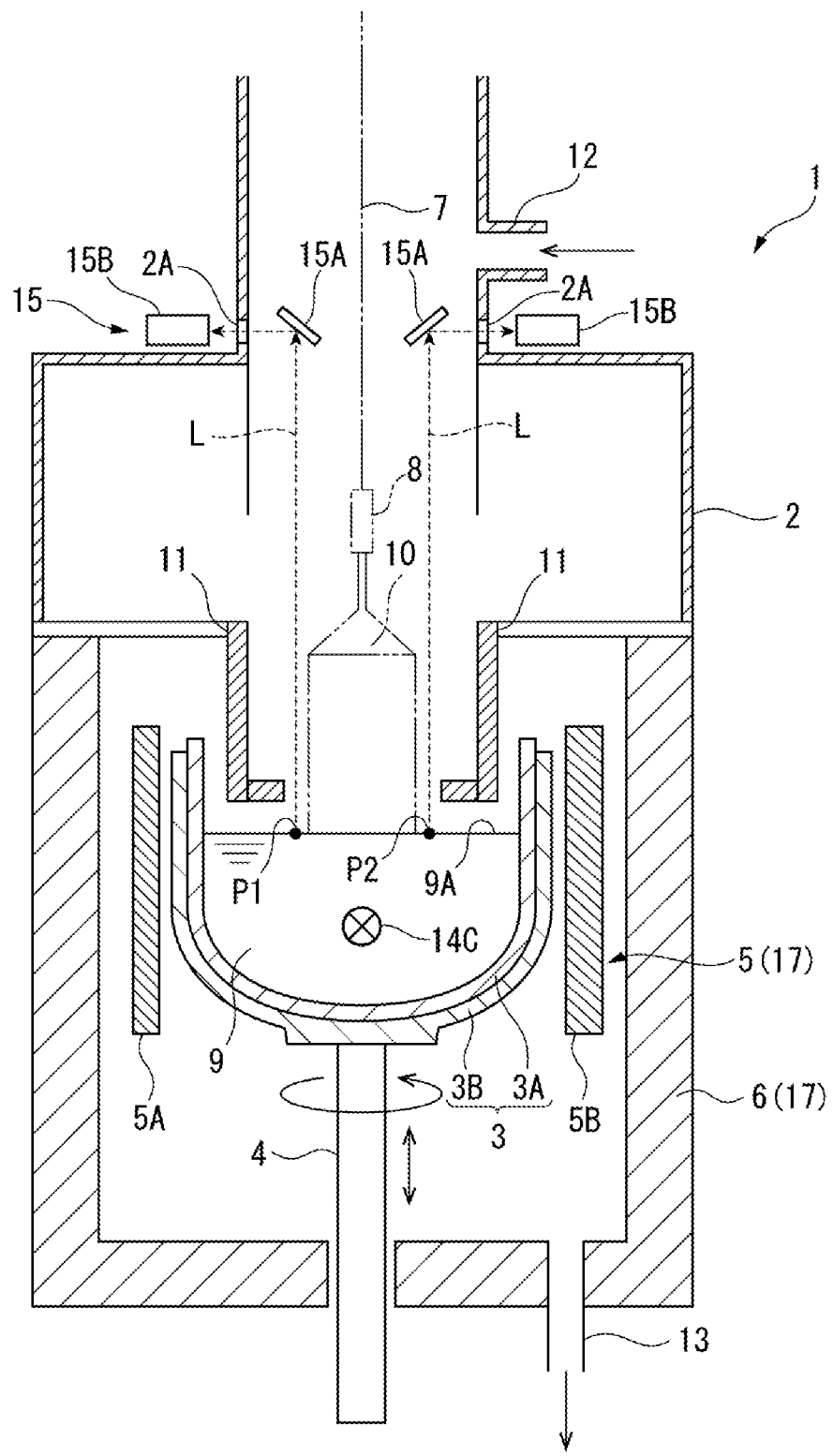

FIG. 1 schematically illustrates an exemplary structure of a pull-up device 1 of monocrystalline silicon to which a manufacturing method of monocrystalline silicon 10 according to a first exemplary embodiment of the invention is applicable. The pull-up device 1, which is a device for pulling up the monocrystalline silicon 10 through the Czochralski method, includes a chamber 2 forming an outer shell and a crucible 3 disposed at the center of the chamber 2.

The crucible 3, which has a double structure of an inner quartz crucible 3A and an outer graphite crucible 3B, is fixed to an upper end of a support shaft 4 that is rotatable and movable up and down.

A resistance heating type heater 5 is provided outside the crucible 3 in a manner to surround the crucible 3. A heat insulation material 6 is provided outside the heater 5 and along an inner surface of the chamber 2. The heater 5, the heat insulation material 6, and a voltage-applying portion 16 (see FIG. 4) for applying voltage to the heater 5 defines a heating portion 17 of the invention.

Figure 2A:
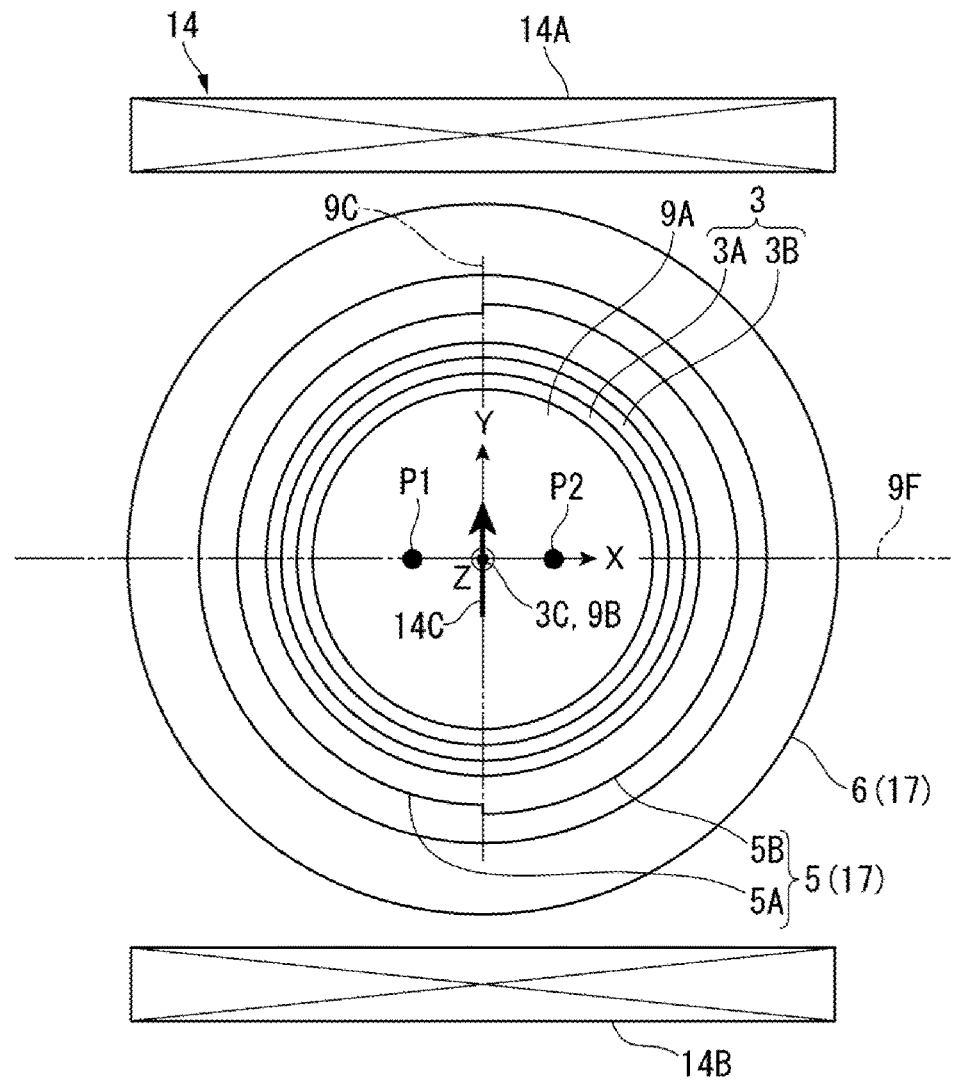
FIG. 2A is a plan view schematically showing a structure of a heating portion and how a horizontal magnetic field is applied in a first exemplary embodiment.
Figure 2B:
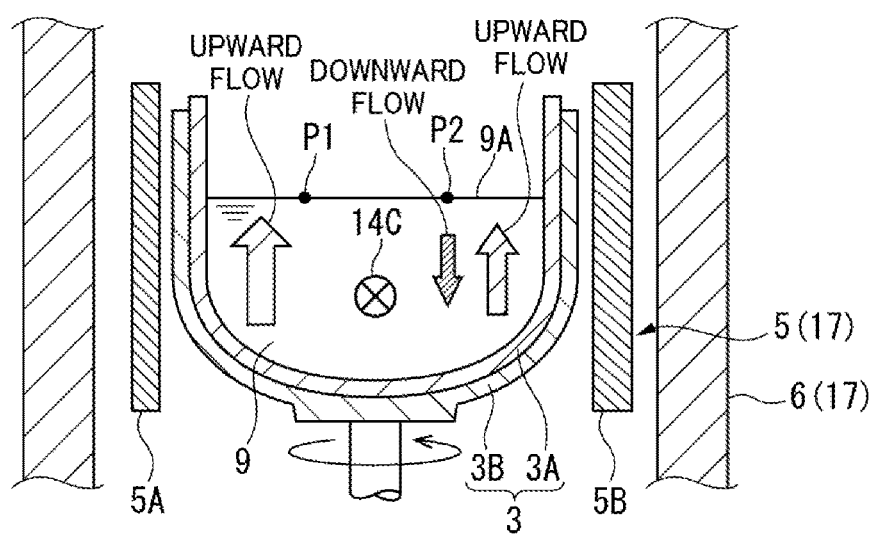
FIG. 2B is a vertical cross section schematically showing the structure of the heating portion and how the horizontal magnetic field is applied in the first exemplary embodiment.

When viewed from vertically above as shown in FIGS. 2A and 2B, the heating portion 17 is configured to have different heating capacities on both sides across an imaginary line 9C that passes through a center 9B of a surface 9A of the silicon melt 9 and is parallel to a central magnetic field line 14C of the horizontal magnetic field.

In the first exemplary embodiment, the heater 5 of the heating portion 17 includes a first heating region 5A located on the left and a second heating region 5B on the right with respect to the imaginary line 9C in FIG. 2A. The first and second heating regions 5A, 5B are each formed in a semi-cylinder whose central angle is 180 degrees in a. A resistance value of the second heating region 5B is smaller than a resistance value of the first heating region 5A. Accordingly, when the voltage-applying portion 16 applies the same magnitude of voltage to the first and second heating regions 5A, 5B, a heat generation amount of the second heating region 5B becomes smaller than that of the first heating region 5A.

A thickness of the heat insulation material 6 is constant all over a circumference thereof. Accordingly, a heat insulation performance of the heat insulation material 6 is also constant all over the circumference thereof.

With the above arrangement, the heating portion 17 has a heating capacity that is lower on the right side than the left side of the heating portion 17 with respect to the imaginary line 9C. Specifically, the heating capacity of the heating portion 17 is set in a first state where the heating capacity of the heating portion 17 is lower in a positive direction than in a negative direction of an X axis with respect to the imaginary line 9C in a right-handed XYZ Cartesian coordinate system defining the center 9B of the surface 9A of the silicon melt 9 as an origin, a vertically upward direction as a positive direction of a Z axis, and a direction in which the horizontal magnetic field is applied as a positive direction of a Y axis.

As shown in FIG. 1, a pull-up shaft 7 (e.g., a wire), which is coaxial with the support shaft 4 and configured to rotate at a predetermined speed in a direction opposite to or the same as the rotation direction of the support shaft 4, is provided above the crucible 3. A seed crystal 8 is attached to a lower end of the pull-up shaft 7.

A hollow cylindrical heat shield 11, which surrounds the growing monocrystalline silicon 10, is disposed in the chamber 2 at a part above a silicon melt 9 in the crucible 3.

The heat shield 11, which shields the growing monocrystalline silicon 10 from high-temperature radiation heat from the silicon melt 9 in the crucible 3, the heater 5 and a side wall of the crucible 3, prevents outward heat diffusion from a solid-liquid interface (i.e., an interface on which crystal grow) and a vicinity thereof, whereby the heat shield 11 serves to control a temperature gradient of a central portion and an outer peripheral portion of the monocrystalline silicon in a direction of the pull-up shaft.

A gas inlet 12, through which an inert gas (e.g. Argon gas) is introduced into the chamber 2, is provided at an upper part of the chamber 2. An exhaust outlet 13, through which the gas in the chamber 2 is sucked and discharged when a vacuum pump (not shown) is driven, is provided at a lower part of the chamber 2.

The inert gas introduced in the chamber 2 through the gas inlet 12, which flows downward between the growing monocrystalline silicon 10 and the heat shield 11 and then flows into a space between a lower end of the heat shield 11 and a liquid surface of the silicon melt 9, flows toward an outside of the heat shield 11 and an outside of the crucible 3 and then downward along the outside of the crucible 3, to be discharged from the exhaust outlet 13.

The pull-up device 1 includes a magnetic-field applying portion 14 as shown in FIG. 2A and a temperature sensor 15.

The magnetic-field applying portion 14 includes a first magnetic body 14A and a second magnetic body 14B each in a form of a solenoid coil. The first and second magnetic bodies 14A and 14B are provided outside the chamber 2 in a manner to face each other across the crucible 3. The magnetic-field applying portion 14 preferably applies a horizontal magnetic field such that a central magnetic field line 14C passes through a center axis 3C of a quartz crucible 3A and the central magnetic field line 14C is directed in a top direction in FIG. 2A (i.e., a direction from a nearby side to a far side on a sheet in FIG. 1). A height of the central magnetic field line 14C, which is not particularly limited, may be determined such that the central magnetic field line 14C passes through an inside or an outside of the silicon melt 9 depending on the quality of the monocrystalline silicon 10.

As shown in FIGS. 1 to 3, the temperature sensor 15 measures temperatures at the first and second measurement points P1, P2 across the imaginary line 9C. The first measurement point P1 is set at such a position to be the maximum temperature point on the surface 9A of the silicon melt 9 when the downward flow is fixed on the right side in FIG. 2B in the silicon melt 9 heated by the heating portion 17. The second measurement point P2 is set at such a position as to be the minimum temperature when the downward flow is fixed on the right side. In the first exemplary embodiment, the first and second measurement points P1, P2 are defined at positions on an imaginary line 9F overlapping the X axis and point-symmetric with respect to the center 9B as shown in FIG. 2A.

The temperature sensor 15 includes a pair of reflectors 15A and a pair of radiation thermometers 15B.

The reflectors 15A are provided inside the chamber 2. The reflectors 15A are preferably provided such that a distance (height) K from each of lower ends of the reflectors 15A to the surface 9A of the silicon melt 9 is in range from 600 mm to 5000 mm as shown in FIG. 3. Moreover, the reflectors 15A are preferably provided such that an angle θf formed by a reflection surface 15C of each of the reflectors 15A and a horizontal plane F is in a range from 40 degrees to 50 degrees. With this arrangement, a sum of an incidence angle θ1 and a reflection angle θ2 of a radiation light L radiated from each of the first and second measurement points P1, P2 in a direction opposite to a gravity direction is in a range from 80 degrees to 100 degrees. The reflectors 15A are preferably in a form of a silicon mirror having a mirror-polished surface as the reflection surface 15C.

The radiation thermometers 15B are provided outside the chamber 2. The radiation thermometers 15B receive the radiation light L incident through quartz windows 2A provided to the chamber 2 and measure the temperatures at the first and second measurement points P1, P2 in a non-contact manner.

Moreover, the pull-up device 1 incudes a controller 20 and a storage 21 as shown in FIG. 4.

The controller 20 includes a convection pattern controller 20A and a pull-up controller 20B.

The convection pattern controller 20A heats the silicon melt 9 by using the heating portion 17 having the heating capacity differing on the right and left sides across the imaginary line 9C and applying the horizontal magnetic field, thereby fixing a direction of a convection flow 90 in the magnetic-field orthogonal cross-section (see FIGS. 5A and 5B).

The pull-up controller 20B pulls up the monocrystalline silicon 10 after the convection pattern controller 20A fixes the direction of the convection flow.

[2] Path to the Invention

The inventors have known that, even if the monocrystalline silicon 10 is pulled up using the same pull-up device 1 under the same pull-up conditions, an oxygen concentration of the pulled-up monocrystalline silicon 10 may sometimes become high or low. In order to solve this problem, a research has been typically focused on the pull-up conditions and the like. However, no definitive solution has been found.

After further research, the inventors have found that, when a solid polycrystalline silicon feedstock is put into the quartz crucible 3A to be dissolved therein and a horizontal magnetic field is applied, the convection flow 90 rotating in a direction from the bottom of the quartz crucible 3A toward the surface 9A of the silicon melt 9 around magnetic field lines of the horizontal magnetic field is observed in the field-orthogonal cross-section (i.e., a cross-sectional plane viewed from the second magnetic body 14B (from the nearby side of the sheet of FIG. 1, and a lower side in FIG. 2A)). The rotation direction of the convection flow 90 is shown in two convection patterns of a case where a clockwise rotation is dominant as shown in FIG. 5A and a case where an anticlockwise rotation is dominant as shown in FIG. 5B.

The inventors have speculated that the occurrence of such a phenomenon is due to the following mechanism.

First, in a state where the horizontal magnetic field is not applied and the quartz crucible 3A is not rotated, the silicon melt 9 is heated in the vicinity of an outer periphery of the quartz crucible 3A, a convection flow occurs in an ascending direction from the bottom of the silicon melt 9 toward the surface 9A. The ascending silicon melt 9 is cooled at the surface 9A of the silicon melt 9, returns to the bottom of the quartz crucible 3A at the center of the quartz crucible 3A, so that a convection flow occurs in a descending direction.

When the convection flow that ascends in the outer periphery of the outer periphery and descends at the center thereof occurs, a position of the downward flow randomly shifts to be offset from the center due to instability of thermal convection. Such a downward flow is generated by a temperature distribution in which the temperature at a part of the surface 9A of the silicon melt 9 corresponding to the downward flow is the lowest and the temperature gradually increases toward an outer part of the surface 9A. For instance, in a state of FIG. 6(A), a temperature of a first region A1 whose center is displaced from the rotation center of the quartz crucible 3A is the lowest, and temperatures of a second region A2, a third region A3, fourth region A4 and a fifth region A5 which are sequentially located outside of the first region A1 become higher in this order. The first measurement point P1, which is the maximum temperature point, is located in the fifth region A5. The second measurement point P2, which is the minimum temperature point, is located in the first region A1 and at the center of the downward flow. The maximum temperature points and the minimum temperature points can be determined in advance by the radiation thermometers.

In the state of FIG. 6(A), when a horizontal magnetic field whose central magnetic field line 14C passes through the central axis 3C of the quartz crucible 3A is applied, rotation of the downward flow is gradually restrained when viewed from above the quartz crucible 3A, and is then restrained at a position offset from the position of the magnetic field line 14C at the center of the horizontal magnetic field as shown in FIG. 6(B).

It is considered that the rotation of the downward flow is restrained after an intensity of the horizontal magnetic field acting on the silicon melt 9 becomes larger than a specific strength. Accordingly, the rotation of the downward flow is not restrained immediately after the application of the horizontal magnetic field is started, but is restrained after a predetermined time has elapsed from the start of the application.

It is reported that a change in the flow inside the silicon melt 9 due to the application of the magnetic field is generally represented by a magnetic number M, which is a dimensionless number obtained by a formula (1) below (Jpn. J. Appl. Phys., Vol. 33 (1994) Part. 2 No. 4A, pp. L487-490).

Numerical Formula 1

$$M = \frac{\sigma B_0^2 h}{\rho v_0} \quad (1)$$

In the formula (1), $\sigma$ represents an electric conductivity of the silicon melt 9, $B_0$ represents the applied magnetic flux density, h represents a depth of the silicon melt 9, ρ represents a density of the silicon melt 9, and $v_o$ represents an average flow velocity of the silicon melt 9 in the absence of the magnetic field.

In an exemplary embodiment, it has been found that the minimum value of the specific strength of the horizontal magnetic field in which the rotation of the downward flow is restrained is 0.01 tesla. Magnetic Number at 0.01 tesla is 1.904. Even with the amount of the silicon melt 9 and the diameter of the quartz crucible 3A different from those of the exemplary embodiment, it is considered that the restraining effect (braking effect) of the downward flow by the magnetic field occurs at least at the magnetic field strength (magnetic flux density) at which Magnetic Number is 1.904.

When the intensity of the horizontal magnetic field is further increased from the state shown in FIG. 6(B), the magnitude of the convection flow in the ascending direction on the right side and the left side of the descending flow changes as shown in FIG. 6 (C), where the upward convection flow on the left side of the downward flow becomes dominant.

Finally, when the magnetic field strength reaches 0.2 tesla, the convection flow in the ascending direction on the right side of the descending flow disappears as shown in FIG. 6(D), where the convection flow flows upward (i.e. in the ascending direction) on the left side and downward (i.e. in the descending direction) on the right side to create the clockwise convection flow 90. In the state of the clockwise convection flow 90, as shown in FIG. 5A, the temperature gradually is increased from the right region 9D toward the left region 9E of the silicon melt 9 in the magnetic-field orthogonal cross-section.

In contrast, if a start position of the downward flow in FIG. 6 (A) is shifted by 180 degrees in the rotation direction of the quartz crucible 3A, the downward flow is restrained at a position on the left side where a phase is shifted by 180 degrees from that in FIG. 6(C), resulting in the anticlockwise convection flow 90. In the state of the anticlockwise convection flow 90, as shown in FIG. 5B, the temperature is gradually decreased from the right region 9D toward the left region 9E of the silicon melt 9.

Such a clockwise or anticlockwise convection flow 90 of the silicon melt 9 is maintained unless the intensity of the horizontal magnetic field is set to less than 0.2 tesla.

Although the direction of the convection flow 90 is fixedly determined clockwise or anticlockwise depending on the state of the convection flow immediately before the horizontal magnetic field is applied, since a position of the downward flow move at random, it is difficult to control the state of the convection flow immediately before the horizontal magnetic field is applied. As a result of further studies, the inventors have found that the direction of the convection flow 90 can be fixed only either clockwise or anticlockwise irrespective of a timing of applying the horizontal magnetic field, by fixing the position of the downward flow by heating the silicon melt 9 with the heating portion 17, which has the heating capacity differing on the right and left sides in the magnetic-field orthogonal cross-section, before applying the horizontal magnetic field, and then applying the horizontal magnetic field.

For instance, while rotating the quartz crucible 3A without applying the horizontal magnetic field as shown in FIG. 2B, when the silicon melt 9 is heated with the heating portion 17, which generates heat such that the heat generation amount is lower at the second heating region 5B than at the first heating region 5A, the temperature at a side of the silicon melt 9 near the second heating region 5B becomes lower than that at a side of the silicon melt 9 near the first heating region 5A independently of the structural symmetry of the pull-up device 1. As a result, the downward flow is fixed at the side of the silicon melt 9 near the second heating region 5B, a small upward flow is generated at a side of the silicon melt 9 between the downward flow and the second heating region 5B, and a large upward flow is generated at a side of the silicon melt 9 between the center and the first heating region 5A. In other words, the state inside the silicon melt 9 becomes the same as shown in FIG. 6(B).

When the horizontal magnetic field of 0.2 tesla or more is applied to the silicon melt 9, the direction of the convection flow 90 is fixed clockwise as shown in FIG. 6(D).

In contrast, when the heating capacity of the heating portion 17 is set in a second state where the heating capacity of the heating portion 17 is higher in the positive direction than in the negative direction of the X axis to cause the temperature of the silicon melt 9 near the second heating region 5B to be higher than that near the first heating region 5A, the direction of the convection flow 90 is fixed anticlockwise.

In light of the above, the inventors have reached an idea that the direction of the convection flow 90 can be fixed in a desired direction to restrain a variation in the oxygen concentration between ingots of monocrystalline silicon 10 by heating the silicon melt 9 with the heating portion 17, which has the heating capacity differing on both sides of the silicon melt 9 across the imaginary line 9C, before applying the horizontal magnetic field, and then applying the horizontal magnetic field of 0.2 tesla or more.

[3] Manufacturing Method of Monocrystalline Silicon

Next, a manufacturing method of monocrystalline silicon in the first exemplary embodiment will be described with reference to the flowchart shown in FIG. 7.

Firstly, pull-up conditions (e.g., a flow rate of inert gas, an internal pressure of the chamber 2, and a rotation speed of the quartz crucible 3A) for achieving a desired value of the oxygen concentration of the monocrystalline silicon 10 are determined in advance as predetermined conditions, and the pull-up conditions are stored in the storage 21. The oxygen concentration of the predetermined condition may be values of the oxygen concentration at a plurality of points in the longitudinal direction of the straight body, or may be an average of the values of the oxygen concentration at the plurality of points.

Manufacturing of the monocrystalline silicon 10 is then started.

Firstly, the pull-up controller 20B keeps an inside of the chamber 2 in an inert gas atmosphere under a reduced pressure. The convection pattern controller 20A melts the solid material such as polycrystalline silicon filled in the crucible 3 with heat from the heater 5 while rotating the crucible 3, thereby generating the silicon melt 9 (Step S1). At this time, the convection pattern controller 20A applies the same magnitude of voltage to the first and second heating regions 5A, 5B using the voltage-applying portion 16, whereby the left side of the silicon melt 9 (near the first heating region 5A) is heated at a higher temperature than the right side of the silicon melt 9 (near the second heating region 5B). The convection pattern controller 20A heats the silicon melt 9 so that the temperature of the silicon melt 9 falls in a range from 1415 degrees C. to 1500 degrees C.

Subsequently, the convection pattern controller 20A judges whether a difference $\Delta T_{max}$ between the maximum temperature (the temperature at the first measurement point P1) and the minimum temperature (the temperature at the second measurement point P2) on the surface 9A of the silicon melt 9 is stable in a range from 6 degrees C. to 12 degrees C. on a basis of the measurement results of the temperatures at the first and second measurement points P1, P2 by the temperature sensor 15 (Step S2). The process in the Step S2 is performed because the downward flow, which is sometimes not fixed on the right side at $\Delta T_{max}$ of less than 6 degrees C., is reliably fixed on the right side of the silicon melt 9 with respect to the imaginary line 9C as shown in FIGS. 2B and 6(B) at $\Delta T_{max}$ of 6 degrees C. or more. The process in the Step S2 is also performed because a variation in a diameter of the monocrystalline silicon 10, which may be caused due to excessively large convection flow at $\Delta T_{max}$ exceeding 12 degrees C. In the pull-up direction, is restrained at $\Delta T_{max}$ of 12 degrees C.

When the convection pattern controller 20A determines that $\Delta T_{max}$ is not stable in the range from 6 degrees C. to 12 degrees C. in Step S2, the convection pattern controller 20A adjusts a heating temperature to the silicon melt 9 (Step S3) and performs the process of Step S2 after an elapse of a predetermined time. In Step S3, the applied voltage to each of the first and second heating regions 5A, 5B is increased by the same magnitude at $\Delta T_{max}$ of less than 6 degrees C. and degreased by the same magnitude at $\Delta T_{max}$ exceeding 12 degrees C.

On the other hand, when the convection pattern controller 20A determines that $\Delta T_{max}$ is stable in the range from 6 degrees C. to 12 degrees C. in Step S2, the convection pattern controller 20A controls the magnetic-field applying portion 14 to start applying the horizontal magnetic field whose intensity is in a range from 0.2 tesla to 0.6 tesla to the silicon melt 9 (Step S4). By the process in Step S4, the convection flow 90 is fixed clockwise.

Subsequently, the pull-up controller 20B dips the seed crystal 8 into the silicon melt 9 while continuously applying the horizontal magnetic field from 0.2 tesla to 0.6 tesla, and then pulls up with the predetermined conditions the monocrystalline silicon 10 having a straight body with a desired oxygen concentration (Step S5).

The processes of Steps S1 to S5 described above correspond to the method of manufacturing monocrystalline silicon of the invention, and the processes of Steps S1 to S4 correspond to the method of controlling the convection pattern of the silicon melt of the invention.

It should be noted that the process of checking $\Delta T_{max}$ in Step S2, the process of adjusting the heating temperature in Step S3, the process of starting applying the horizontal magnetic field in Step S4, and/or the pull-up process in Step S5 may be performed through an operation of the operator.

[4] Operations and Effects in Exemplary Embodiment

According to the above exemplary embodiment, the direction of the convection flow 90 in the magnetic-field orthogonal cross-section can be easily fixed in one direction independently of the structural symmetry of the pull-up device by a simple method of using the heating portion 17 having the heating capacity differing on the right and left sides of the silicon melt across the imaginary line 9C. Accordingly, such fixation of the convection flow 90 in one direction can restrain a variation in the oxygen concentration between ingots of the monocrystalline silicon 10.

Particularly, with a simple method of only using the heater 5 in which the first and second heating regions 5A, 5B are different in the resistance value, the variation in the oxygen concentration between ingots of the monocrystalline silicon 10 can be restrained.

Since the horizontal magnetic field of 0.2 tesla or more is applied after $\Delta T_{max}$ becomes 6 degrees C. or more, the direction of the convection flow can be reliably fixed in one direction.

Since the horizontal magnetic field of 0.2 tesla or more is applied after $\Delta T_{max}$ becomes 12 degrees C. or less, a variation in the diameter of the monocrystalline silicon 10 can be restrained.

[5] Second Exemplary Embodiment

Next, a second exemplary embodiment of the invention will be described. In the following description, the same reference numerals will be given to the components already described and the description thereof will be omitted.

The second exemplary embodiment is different from the first exemplary embodiment in a structure of a heating portion 31 and a structure of a controller 40.

The heating portion 17 includes a heater 30, the heat insulation material 6 as shown in FIGS. 8A, 8B, and a voltage-applying portion 16A (see FIG. 4).

The heater 30 includes a first section heater 30A on the left and a second section heater 30B on the right with respect to the imaginary line 9C. The first and second section heaters 30A, 30B are separate bodies shaped in the same-sized semi-cylinder in a plan view. Moreover, the first and second section heaters 30A, 30B are the same in terms of the resistance value.

The voltage-applying portion 16A applies a smaller voltage to the second section heater 30B than to the first section heater 30A. In other words, the power of the second section heater 30B is made smaller than the power of the first section heater 30A. Accordingly, the heat generation amount of the second section heater 30B becomes smaller than the heat generation amount of the first section heater 30A.

Moreover, the heat insulation performance of the heat insulation material 6 is constant all over the circumference thereof in the same manner as in the first exemplary embodiment.

With the above arrangement, the heating portion 31 has a heating capacity that is lower on the right side than the left side of the heating portion 31 with respect to the imaginary line 9C.

The controller 40 includes a convection pattern controller 40A and the pull-up controller 20B as shown in FIG. 4.

[6] Manufacturing Method of Monocrystalline Silicon

Next, the manufacturing method of monocrystalline silicon in the second exemplary embodiment will be described.

It should be noted that the description of the same process(es) as in the first exemplary embodiment is omitted or simplified.

Firstly, as shown in FIG. 7, the controller 40 performs the processes of Steps S1 and S2 in the same manner as in the first exemplary embodiment and, as required, the process in Step S3.

In Step S1, the convection pattern controller 40A applies a smaller voltage to the second section heater 30B than to the first section heater 30A using the voltage-applying portion 16A, whereby the left side of the silicon melt 9 (near the first section heater 30A) is heated at a higher temperature than the right side of the silicon melt 9 (near the second section heater 30B).

In Step S3, the applied voltage to the second section heater 30B is decreased or the applied voltage to the first section heater 30A is increased at $\Delta T_{max}$ of less than 6 degrees C., and the applied voltage to the second section heater 30B is increased or the applied voltage to the first section heater 30A is decreased at $\Delta T_{max}$ exceeding 12 degrees C.

When the convection pattern controller 40A judges that $\Delta T_{max}$ becomes stable in a range from 6 degrees C. to 12 degrees C. in Step S2, the controller 40 performs the processes of Steps S4, S5. Since the downward flow is fixed on the right before the process of Step S4, the process of Step S5 is performed with the convection flow 90 being reliably fixed clockwise by the process of Step S4.

[7] Operations and Effects in Second Exemplary Embodiment

The second exemplary embodiment as described above can provide the following operations and effects in addition to the same operations and effects in the first exemplary embodiment.

With a simple method of only applying different voltages to the first and second section heaters 30A and 30B forming the heater 30, the variation in the oxygen concentration between ingots of the monocrystalline silicon 10 can be restrained.

[8] Third Exemplary Embodiment

Next, a third exemplary embodiment of the invention will be described. In the following description, the same reference numerals will be given to the components already described and the description thereof will be omitted.

The third exemplary embodiment is different from the first exemplary embodiment in a structure of a heating portion 52.

The heating portion 52 includes a heater 50, a heat insulation material 51 as shown in FIGS. 9A, 9B, and the voltage-applying portion 16 (see FIG. 4).

The heater 50 is formed cylindrical in a plan view. A resistance value of the heater 50 is constant all over a circumference thereof. Accordingly a heat generation amount of the heater 50 is constant all over the circumference thereof.

The heat insulation material 51 includes a first divided heat insulation material 51A on the left and a second divided heat insulation material 51B on the right with respect to the imaginary line 9C. The first and second divided heat insulation materials 51A, 51B are separate bodies shaped in a semi-cylinder in a plan view. The second divided heat insulation material 51B is smaller than the first divided heat insulation material 51A in thickness and volume. Accordingly, a heat insulation performance of the second divided heat insulation material 51B becomes smaller than that of the first divided heat insulation material 51A.

With the above arrangement, since the second divided heat insulation material 51B more easily releases heat toward outside of the chamber 2 than the first divided heat insulation material 51A even when the heat generation amount of the heater 50 is constant all over the circumference, the heating capacity of the heating portion 52 to the right side of the silicon melt becomes lower than to the left side with respect to the imaginary line 9C.

[9] Manufacturing Method of Monocrystalline Silicon

Next, the manufacturing method of monocrystalline silicon in the third exemplary embodiment will be described.

It should be noted that the description of the same process(es) as in the first exemplary embodiment is omitted or simplified.

Firstly, as shown in FIG. 7, the controller 20 performs the processes of Steps S1 and S2 as in the same manner as in the first exemplary embodiment and, as required, the process in Step S3.

In Step S1, the convection pattern controller 20A applies voltage to the heater 50 using the voltage-applying portion 16. Since the first and second divided heat insulation materials 51A, 51B are different from each other in the heat insulation performance as described above, the left side of the silicon melt 9 (near the first divided heat insulation material 51A) is heated at the higher temperature than the right side of the he silicon melt 9 (near the second divided heat insulation material 51B).

In Step S3, the applied voltage to the heater 5 is increased at $\Delta T_{max}$ of less than 6 degrees C. and is decreased at $\Delta T_{max}$ exceeding 12 degrees C.

When the convection pattern controller 20A judges that $\Delta T_{max}$ becomes stable in a range from 6 degrees C. to 12 degrees C. in Step S2, the controller 20 performs the processes of Steps S4, S5. Since the downward flow is fixed on the right before the process of Step S4, the process of Step S5 is performed with the convection flow 90 being reliably fixed clockwise by the process of Step S4.

[10] Operations and Effects in Third Exemplary Embodiment

The third exemplary embodiment as described above can provide the following operations and effects in addition to the same operations and effects in the first exemplary embodiment.

With a simple method of only differentiating the heat insulation performances of the first divided heat insulation material 51A and the second divided heat insulation material 51B forming the heat insulation material 51, the variation in the oxygen concentration between ingots of the monocrystalline silicon 10 can be restrained.

[11] Modification(s)

It should be understood that the scope of the invention is not limited by the above exemplary embodiments, but various improvements and design modifications compatible with the invention are possible.

For instance, in some embodiments, a cylindrical heater surrounding the crucible 3 with a distance between an outer periphery of the crucible 3 and an inner periphery of the heater being different between the right side and the left side of the imaginary line 9C is used to differentiate the heating capacity of the right side from that of the left side.

In the third exemplary embodiment, the first and second divided heat insulation materials 51A, 51B may be integrated. Moreover, for instance, in some embodiments, the first and second divided heat insulation materials 51A, 51B are formed of different materials having different heat insulation performances. In this case, the first and second divided heat insulation materials 51A, 51B are the same or different in size.

In some embodiments, the heat insulation material 6 in the first and second exemplary embodiments is replaced by the heat insulation material 51 in the third exemplary embodiment.

In the process of Step S2 in the first, second and third exemplary embodiments, it is judged whether $\Delta T_{max}$ is stable in a range from 6 degrees C. to 12 degrees C. However, for instance, in some embodiments, it is checked in advance how many minutes have elapsed after the application of voltage starts until $\Delta T_{max}$ is stable in a range from 6 degrees C. to 12 degrees C., and it is judged whether $\Delta T_{max}$ is stable in a range from 6 degrees C. to 12 degrees C. on a basis of the elapsed time after the start of the application of voltage without measuring the temperatures at the first and second measurement points P1, P2.

The heating capacities of the heating portions 17, 31, 52, which are set such that the downward flow is fixed on the imaginary line 9F overlapping the X axis as shown in FIG. 6(B), in the first to third exemplary embodiments, are set in some embodiments such that the downward flow is fixed at a position rotated by less than 90 degrees in the positive direction or the negative direction of the Y axis around the center 9B from the position shown in FIG. 6(B). For instance, in some embodiments, the heating capacities of the heating portions 17, 31, 52 are set such that the downward flow is fixed between the position shown in FIG. 6(A) and the position shown in FIG. 6(B). Even with the above arrangement, when the horizontal magnetic field of 0.2 tesla or more is applied, the direction of the convection flow 90 is fixed clockwise.

In the first to third exemplary embodiments, the horizontal magnetic field may be applied even when $\Delta T_{max}$ is in a range from 3 degrees C. to less than 6 degrees C., thereby manufacturing the monocrystalline silicon 10. Even in this case, a variation in the oxygen concentration between ingots of the monocrystalline silicon 10 can be restrained.

In the first to third exemplary embodiments, the horizontal magnetic field may be applied even when $\Delta T_{max}$ exceeds 12 degrees C., thereby manufacturing the monocrystalline silicon 10. Even in this case, a variation in the oxygen concentration between ingots of the monocrystalline silicon 10 can be restrained.

In the first to third exemplary embodiments, the heating capacities of the heating portions 17, 31, 52 are set in the first state. However, in some embodiments, the heating capacities of the heating portions 17, 31, 52 are set in the second state where the heating capacities of the heating portions 17, 31, 52 is higher in the positive direction of the X axis than in the negative direction thereof, whereby the downward flow is fixed on the left and the convection flow 90 is fixed anticlockwise.

Although the plane viewed from the second magnetic body 14B (the nearby side of the sheet of FIG. 1) is exemplarily shown as the field-orthogonal cross-section, a plane viewed from the first magnetic body 14A (the far side of the sheet of FIG. 1) may be defined as the field-orthogonal cross-section for the estimation process of the direction of the convection flow 90.

EXAMPLE(S)

Next, Examples of the invention will be described. It should be noted that the invention is by no means limited to Examples.

Experiment 1: Relationship Between Resistance Ratio of Heater and Convection Controllability/Crystal Growth Characteristics Experimental Example 1

First, a pull-up device provided with the heating portion 17 according to the first exemplary embodiment was prepared. The quartz crucible 3A having a 32-inch inner diameter was prepared. As the heater 5 for fixing the convection flow clockwise, a heater having a resistance ratio of 1.10 as shown in FIGS. 2A and 2B was prepared, the resistance ratio being a value obtained by dividing a resistance value of the first heating region 5A (left) by a resistance value of the second heating region 5B (right).

Polycrystalline silicon was put into the quartz crucible 3A and 35-V voltage was applied to each of the first and second heating regions 5A, 5B to generate the silicon melt 9. Subsequently, while the temperature of the silicon melt 9 is kept stable, the temperature difference $\Delta T_{max}$ between the first and second measurement points P1, P2 set at point-symmetric positions on the imaginary line 9F with respect to the center 9B was obtained. Subsequently, the horizontal magnetic field of 0.2 tesla or more was applied and the temperatures at the first and second measurement points P1, P2 were again measured. After the direction of the convection flow was judged based on the temperature difference, the monocrystalline silicon 10 was pulled up. When the temperature at the first measurement point P1 was higher than that at the second measurement point P2 after the horizontal magnetic field was applied, the direction of the convection flow was determined to be fixed clockwise. In the opposite case, the direction of the convection flow was determined to be fixed anticlockwise.

Experimental Examples 2 to 6

In each of Experimental Examples 2 to 6 conducted under the same conditions as in Experimental Example 1 except that the resistance ratio was set as shown in Table 1, the temperature difference $\Delta T_{max}$ was obtained, the direction of the convection flow was judged, and then the monocrystalline silicon 10 was pulled up.

Experiment 2: Relationship Between Power Ratio of Heater and Convection Controllability/Crystal Growth Characteristics Experimental Example 7

First, a pull-up device provided with the heating portion 31 according to the second exemplary embodiment was prepared as shown in FIGS. 8A, 8B in order to fix the direction of the convection flow clockwise.

Voltage was applied to each of the first and second section heaters 30A, 30B such that a power ratio, which was obtained by dividing a power of the first section heater 30A (left) by a power of the second section heater 30B (right), became 1.10 to generate the silicon melt 9. Then, the temperature difference $\Delta T_{max}$ was obtained, the direction of the convection flow was judged, and then the monocrystalline silicon 10 was pulled up in the same manner as in Experiment 1.

Experimental Examples 8 to 12

In each of Experimental Examples 8 to 12 conducted under the same conditions as in Experimental Example 7 except that the power ratio was set as shown in Table 2, the temperature difference $\Delta T_{max}$ was obtained, the direction of the convection flow was judged, and then the monocrystalline silicon 10 was pulled up.

Experiment 3: Relationship Between Volume Ratio of Heat Insulation Material and Convection Controllability/Crystal Growth Characteristics Experimental Example 13

First, a pull-up device provided with the heating portion 52 according to the third exemplary embodiment was prepared as shown in FIGS. 9A, 9B in order to fix the direction of the convection flow clockwise. The heat insulation material 51 having a volume ratio (i.e. a value being obtained by dividing a volume of the first divided heat insulation material 51A (left) by a volume of the second divided heat insulation material 51B (right)) of 1.10 was prepared. The heat insulation performance of the second divided heat insulation material 51B was made smaller than that of the first divided heat insulation material 51A by forming the first and second divided heat insulation material 51A, 51B with the same material.

Voltage was applied such that the power of the heater 50 became 120 kW to generate the silicon melt 9. The temperature difference $\Delta T_{max}$ was obtained in the same manner as in Experiment 1, the direction of the convection flow was judged, and then the monocrystalline silicon 10 was pulled up.

Experimental Examples 14 to 18

In each of Experimental Examples 14 to 18 conducted under the same conditions as in Experimental Example 13 except that the volume ratio was set as shown in Table 3, the temperature difference $\Delta T_{max}$ was obtained, the direction of the convection flow was judged, and then the monocrystalline silicon 10 was pulled up.

Evaluation

Experimental Examples 1 to 18, in each of which ten experiments were conducted, were evaluated in terms of convection controllability (i.e., whether the direction of the convection flow was controlled in a predetermined direction) and crystal growth characteristics (i.e., whether a variation in the diameter of the monocrystalline silicon 10 in the pull-up direction was restrained).

Experimental Examples 1 to 18 were evaluated as C, B and A at 50% or less, more than 50% to less than 100%, and 100%, respectively, in terms of the convection control probability (i.e., a probability that the direction of the convection flow was controlled clockwise).

Experimental Examples 1 to 18 were respectively evaluated in terms of the crystal growth characteristics as "C", "B" and "A" at 1 mm or more, 0.5 mm and more and less than 1 mm, and less than 0.5 mm of the variation in the diameter in the pull-up direction.

In terms of comprehensive judgement, Experimental Examples 1 to 18 were evaluated as "C" when at least one of the convection controllability and the crystal growth characteristics was graded as "C", "B" when the convection controllability was graded as "B" and the crystal growth characteristics was graded as "A", and "A" when both of the convection controllability and the crystal growth characteristics were graded as "A".

Evaluation results of Experimental Examples 1 to 6, 7 to 12, and 13 to 18 are shown in Tables 1, 2, 3.

TABLE 1

|  | Resistance ratio of heater (left side/right side) | $\Delta T_{max}$ (° C.) | Convection control probability (%) | Convection controllability | Crystal growth characteristics | Comprehensive judgement |
|---|---|---|---|---|---|---|
| Example 1 | 1.10 | 2 | 50 | C | A | C |
| Example 2 | 1.20 | 3 | 60 | B | A | B |
| Example 3 | 1.30 | 6 | 100 | A | A | A |
| Example 4 | 1.40 | 10 | 100 | A | A | A |
| Example 5 | 1.50 | 12 | 100 | A | A | A |
| Example 6 | 1.60 | 15 | 100 | A | C | C |

TABLE 2

|  | Heater power ratio (lest side/right side) | $\Delta T_{max}$ (° C.) | Convection control probability (%) | Convection controllability | Crystal growth characteristics | Comprehensive judgement |
|---|---|---|---|---|---|---|
| Example 7 | 1.10 | 1 | 50 | C | A | C |
| Example 8 | 1.20 | 3 | 60 | B | A | B |
| Example 9 | 1.30 | 6 | 100 | A | A | A |
| Example 10 | 1.40 | 9 | 100 | A | A | A |
| Example 11 | 1.50 | 11 | 100 | A | A | A |
| Example 12 | 1.60 | 15 | 100 | A | C | C |

TABLE 3

|  | Heat insulation material volume ratio (left side/right side) | $\Delta T_{max}$ (° C.) | Convection control probability (%) | Convection controllability | Crystal growth characteristics | Comprehensive judgement |
|---|---|---|---|---|---|---|
| Example 13 | 1.10 | 3 | 60 | B | A | B |
| Example 14 | 1.20 | 4 | 60 | B | A | B |
| Example 15 | 1.30 | 7 | 100 | A | A | A |
| Example 16 | 1.40 | 10 | 100 | A | A | A |

TABLE 3-continued

| | Heat insulation material volume ratio (left side/right side) | $\Delta T_{max}$ (° C.) | Convection control probability (%) | Convection controllability | Crystal growth characteristics | Comprehensive judgement |
|---|---|---|---|---|---|---|
| Example 17 | 1.50 | 11 | 100 | A | A | A |
| Example 18 | 1.60 | 14 | 100 | A | C | C |

As shown in Tables 1 to 3, the convection controllability was graded as C in Experimental Examples 1 and 7 where $\Delta T_{max}$ was in a range from 1 to 2 degrees C., B in Experimental Examples 2, 8, 13 and 14 where $\Delta T_{max}$ was in a range from 3 to 4 degrees C., and A in Experimental Examples 3 to 6, 9 to 12, and 15 to 18 where $\Delta T_{max}$ was 6 degrees C. or more.

In view of the above, it was confirmed that the direction of the convection flow was easily controlled by providing the heating portion such that $\Delta T_{max}$ became 3 degrees C. or more. Moreover, it was confirmed that the direction of the convection flow was reliably controlled by providing the heating portion such that $\Delta T_{max}$ became 6 degrees C. or more.

Moreover, the crystal growth characteristics was graded as C in Experimental Examples 6, 12, 18 where $\Delta T_{max}$ was in a range from 14 and 15 degrees C., and A in Experimental Examples 1 to 5, 7 to 11 and 13 to 17 where $\Delta T_{max}$ was 12 degrees C. or less.

In view of the above, it was confirmed that the variation in the diameter of the monocrystalline silicon 10 in the pull-up direction was restrained by providing the heating portion such that $\Delta T_{max}$ was 12 degrees C. or less.

The invention claimed is:

1. A convection pattern control method of a silicon melt used for manufacturing monocrystalline silicon, the method comprising:
    while rotating the quartz crucible without applying a horizontal magnetic field heating the silicon melt in a quartz crucible in a magnetic-field-free state with a heating portion, wherein:
        the heating portion has a heating capacity that differs on both sides across an imaginary line passing through a center axis of the quartz crucible, the imaginary line being in parallel to a central magnetic field line of the horizontal magnetic field that would exist in a case that the horizontal magnetic field is on in a case that the quartz crucible is viewed from vertically above, the heating portion is provided outside the quartz crucible,
        the heating portion comprises a heater surrounding the quartz crucible, and
        the heater has a resistance value that differs on both sides across the imaginary line; and then
    applying the horizontal magnetic field to the silicon melt in the quartz crucible while rotating the quartz crucible and heating the silicon melt in the quartz crucible,
    wherein
        in the applying of the horizontal magnetic field, the horizontal magnetic field of 0.2 tesla or more is applied to fix a direction of a convection flow in a single direction in the silicon melt in a plane orthogonal to a direction in which the horizontal magnetic field is applied,
        the heating capacity of the heating portion is set in a first state where the heating capacity of the heating portion is lower in a positive direction than in a negative direction of an X axis or in a second state where the heating capacity of the heater is higher in the positive direction than in the negative direction of the X axis with respect to the imaginary line as viewed from a positive direction of a Z axis in a right-handed XYZ Cartesian coordinate system defining a center of a surface of the silicon melt as an origin, a vertically upward direction as the positive direction of the Z axis, and a direction in which the horizontal magnetic field is applied as a positive direction of a Y axis, and
        in the applying of the horizontal magnetic field, the direction of the convection flow as viewed in a negative direction of the Y axis is fixed clockwise in a case that the heating capacity is in the first state, and the direction of the convection flow is fixed anticlockwise in a case that the heating capacity is in the second state.

2. The convection pattern control method according to claim 1, wherein in the heating of the silicon melt, the silicon melt is heated such that a difference between a maximum temperature and a minimum temperature on the surface of the silicon melt is 6 degrees C. or more.

3. The convection pattern control method according to claim 2, wherein in the heating of the silicon melt, the silicon melt is heated such that the difference between the maximum temperature and the minimum temperature is 12 degrees C. or less.

4. A manufacturing method of monocrystalline silicon, comprising:
    conducting the convection pattern control method of the silicon melt according to claim 1; and
    pulling up the monocrystalline silicon while an intensity of the horizontal magnetic field is kept at 0.2 tesla or more.

* * * * *